(12) United States Patent
Wada et al.

(10) Patent No.: US 10,943,811 B2
(45) Date of Patent: Mar. 9, 2021

(54) TAPE AFFIXING APPARATUS

(71) Applicant: DISCO CORPORATION, Tokyo (JP)

(72) Inventors: Masahiro Wada, Tokyo (JP); Hiroshi Yoshimura, Tokyo (JP); Toshiyasu Rikiishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 78 days.

(21) Appl. No.: 16/564,647

(22) Filed: Sep. 9, 2019

(65) Prior Publication Data

US 2020/0090976 A1 Mar. 19, 2020

(30) Foreign Application Priority Data

Sep. 18, 2018 (JP) .............................. JP2018-173490

(51) Int. Cl.
*B32B 37/00* (2006.01)
*H01L 21/683* (2006.01)
*H01L 21/67* (2006.01)

(52) U.S. Cl.
CPC .... *H01L 21/6836* (2013.01); *H01L 21/67132* (2013.01); *H01L 2221/68318* (2013.01); *H01L 2221/68327* (2013.01)

(58) Field of Classification Search
USPC ......................................................... 156/497
See application file for complete search history.

(56) References Cited

U.S. PATENT DOCUMENTS

| 8,110,058 B2 * | 2/2012 | Kaneshima ............. B29C 63/02 |
| | | 156/228 |
| 2015/0013917 A1* | 1/2015 | Inao ................... H01L 21/02057 |
| | | 156/703 |

FOREIGN PATENT DOCUMENTS

JP          2011086687 A       4/2011

* cited by examiner

*Primary Examiner* — James D Sells
(74) *Attorney, Agent, or Firm* — Greer Burns & Crain Ltd.

(57) ABSTRACT

A tape affixing apparatus includes: a holding unit including a frame holding unit and a wafer holding portion; a feeding unit configured to feed a tape unit; a winding unit configured to wind a sheet from which a dicing tape is peeled off; a plate configured to be brought into contact with the sheet and peel the tape off from the sheet by bending the tape unit with the sheet on the inside; an affixing roller configured to affix the peeled-off tape to a frame and a wafer; and a nozzle configured to blow air so as to make the peeled-off tape conform to the affixing roller.

1 Claim, 6 Drawing Sheets

TAPE AFFIXING APPARATUS

BACKGROUND OF THE INVENTION

Field of the Invention

The present invention relates to a tape affixing apparatus that affixes a tape to a ring frame and a wafer.

Description of the Related Art

There is a tape affixing apparatus that affixes a circular dicing tape to a ring frame having a circular opening and thereby closes the opening, affixes a wafer to the dicing tape in the opening part, and thereby integrates the ring frame and the wafer with each other by the dicing tape (see Japanese Patent Laid-Open No. 2011-086687, for example).

SUMMARY OF THE INVENTION

The above-described tape affixing apparatus uses a tape unit integrated with circular dicing tapes by arranging and affixing the circular dicing tapes at equal intervals in a longitudinal direction of a band-shaped sheet. The tape unit is wound in a roll shape around a roll tube with the dicing tape side on the inside. In a state in which a supporting cylinder of the tape affixing apparatus is fitted with the roll tube of the tape unit in a roll shape, the sheet is gripped and extracted from an outer circumferential end of the rolled tape, and an end of a dicing tape is peeled off from the sheet while the sheet is bent by pressing a peeling plate against the sheet with the sheet side on the inside. Then, the end of the dicing tape peeled off from the sheet is positioned on the ring frame. The end of the dicing tape is affixed to the ring frame by pressing the dicing tape against the ring frame by a rolling roller. Further, the dicing tape is pressed by the roller while the sheet is peeled off. The dicing tape is thus affixed to affixing surfaces, that is, an upper surface of the wafer and an upper surface of the ring frame.

Here, the dicing tape is peeled off from the sheet at a height position of an edge of the peeling plate pressed against the sheet. Thus, the peeling plate is preferably close to the affixing surfaces in order to prevent entry of dust and air bubbles between the affixing surfaces of the ring frame and the wafer and the dicing tape.

However, when the peeling plate is brought close to the affixing surfaces, a gap is formed between the edge of the peeling plate and a side surface of the roller. The gap causes a slack in the dicing tape. The tension of the dicing tape affixed to the ring frame and the wafer is therefore not uniform. That is, a tension at a start of affixing the dicing tape is low, and thereafter a uniform tension is generated. Thus, the tension as a whole is not uniform. In addition, depending on the kind of the dicing tape, a wrinkle occurs between the ring frame and the wafer. In addition, when the tension of the affixed dicing tape is not uniform, chips come into contact with each other and chipping occurs at a time of division of the wafer or the like.

It is accordingly an object of the present invention to provide a tape affixing apparatus that affixes a dicing tape to a ring frame and a wafer such that the tension of the dicing tape affixed is uniform.

In accordance with an aspect of the present invention, there is provided a tape affixing apparatus for integrating a ring frame and a wafer disposed in an opening of the ring frame by a dicing tape by peeling off the dicing tape from a band-shaped sheet of a band-shaped tape unit formed by arranging and affixing circular dicing tapes in a longitudinal direction of the sheet, and affixing the dicing tape to the ring frame and the wafer, the tape affixing apparatus including: holding means including a ring frame holding portion holding the ring frame and a wafer holding portion holding the wafer within the opening of the ring frame; a feeding unit configured to feed the tape unit by rotating in a state of sandwiching the tape unit; a winding unit configured to wind the sheet by rotating in a state of sandwiching the sheet from which the dicing tape is peeled off; a peeling plate configured to be brought into contact with the sheet between the feeding unit and the winding unit, and peel the dicing tape off from the sheet by bending the tape unit with the sheet on an inside; an affixing roller configured to affix the dicing tape peeled off from the sheet to the ring frame and the wafer while pressing the dicing tape against the ring frame and the wafer; and an air nozzle configured to blow air so as to make the dicing tape peeled off from the sheet conform to the affixing roller; the tape unit passing through a gap between an end portion of the peeling plate and a side surface of the affixing roller, the dicing tape peeled off at the end portion of the peeling plate being made to conform to the side surface of the affixing roller by the air blown from the air nozzle, and the dicing tape being affixed to the ring frame and the wafer such that no slack occurs in the dicing tape.

According to the tape affixing apparatus in accordance with the present invention, the gap between the end portion of the peeling plate and the side surface of the affixing roller is reduced to a size only allowing the tape unit to pass through, the dicing tape peeled off from the sheet bent by the peeling plate is made to conform to the side surface of the affixing roller by the air blown from the air nozzle, and the dicing tape is affixed to the ring frame and the wafer in a state of conforming to the side surface of the affixing roller such that no slack occurs in the dicing tape. The tension of the affixed dicing tape can therefore be made uniform.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
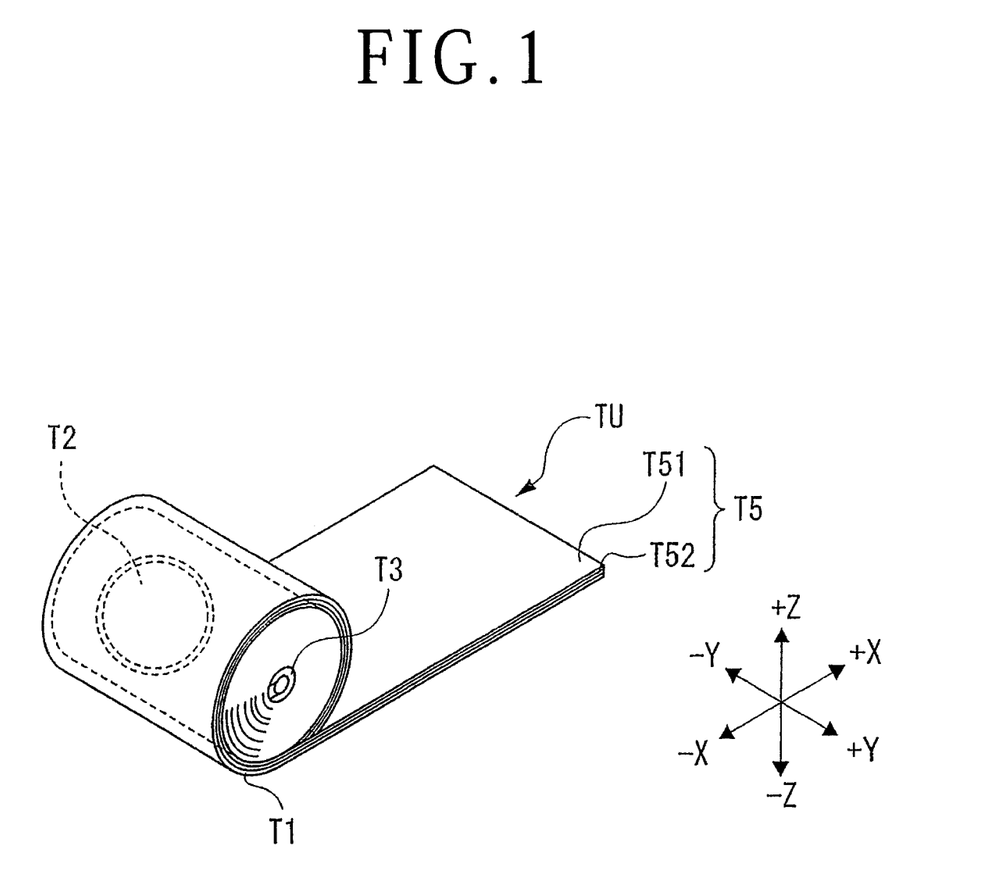
FIG. 1 is a perspective view depicting an example of a tape unit wound in a roll shape.

A tape unit TU (having a thickness of 200 µm, for example) depicted in FIG. 1 has a structure in which a band-shaped adhesive tape T5 and a band-shaped sheet T1 are laminated to each other. The adhesive tape T5 is, for example, constituted of a base material T51 formed of a polyolefin resin or the like and an adhesive layer T52 on the base material T51. The sheet T1 (having a thickness of 100 µm, for example) is affixed to the adhesive layer T52 side. The adhesive tape T5 depicted in the present embodiment is precut in advance into a plurality of circular shapes according to the diameter of a ring frame F (see FIG. 2) to be affixed. A plurality of dicing tapes T2 formed by precutting the adhesive tape T5 are affixed to the sheet T1 at equal intervals in a longitudinal direction (X-axis direction in FIG. 1) of the sheet T1. Incidentally, the material and the like of the adhesive tape T5 and the sheet T1 are not particularly limited.

The tape unit TU in which the circular dicing tapes T2 are arranged and affixed in the longitudinal direction of the above-described band-shaped sheet T1 is wound in a roll shape around a roll tube T3 with the dicing tapes T2 on the inside, as depicted in FIG. 1.

Figure 2:
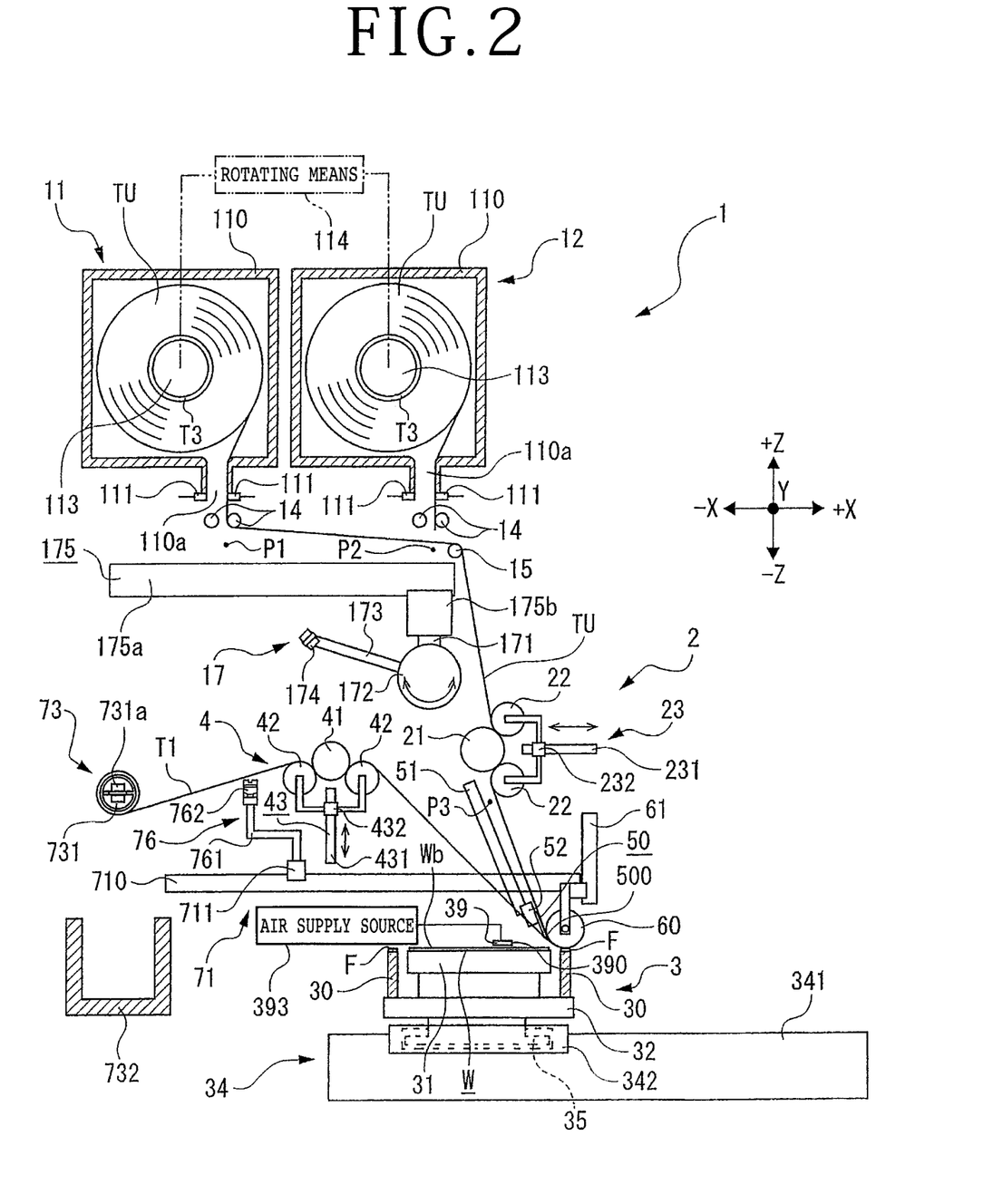
FIG. 2 is a schematic sectional view depicting an example of a configuration of a tape affixing apparatus.

A tape affixing apparatus 1 depicted in FIG. 2 is an apparatus for integrating a ring frame F and a wafer W with each other by a dicing tape T2 depicted in FIG. 1. The tape affixing apparatus 1 includes at least: holding means 3 constituted of a ring frame holding portion 30 that holds the ring frame F and a wafer holding portion 31 that holds the wafer W within an opening of the ring frame F; a feeding unit 2 that feeds the tape unit TU by rotating in a state of sandwiching the tape unit TU; a winding unit 4 that winds the sheet T1 by rotating in a state of sandwiching the sheet T1 from which the dicing tape T2 is peeled off; a peeling plate 50 that is brought into contact with the sheet T1 between the feeding unit 2 and the winding unit 4, and peels the dicing tape T2 off from the sheet T1 by bending the tape unit TU with the sheet T1 on the inside; an affixing roller 60 that affixes the dicing tape T2 peeled off from the sheet T1 to the ring frame F and the wafer W while pressing the dicing tape T2 against the ring frame F and the wafer W; and an air nozzle 39 that blows air so as to make the dicing tape T2 peeled off from the sheet T1 conform to the affixing roller 60.

The tape affixing apparatus 1, for example, includes first tape unit supporting means 11 and second tape unit supporting means 12 supporting the tape unit TU wound in a roll shape. The first tape unit supporting means 11 and the second tape unit supporting means 12 have configurations similar to each other. The configuration of the first tape unit supporting means 11 will therefore be described in the following.

The first tape unit supporting means 11 has a case 110 housing the tape unit TU. An opening 110a for passing the tape unit TU is formed in a bottom wall of the case 110. End detecting units 111 that are formed by an optical sensor or the like and detect an end of the tape unit TU are arranged at edge portions of the opening 110a.

A supporting cylinder 113 fitted with the roll tube T3 around which the tape unit TU is wound is provided within the case 110. The supporting cylinder 113 can be rotated about an axis in a Y-axis direction by rotating means 114. Incidentally, a lid not depicted in the figure which lid can be opened and closed is disposed on the near side of the case 110 (near side of a paper plane in the Y-axis direction).

A pair of guide rollers 14 is each disposed immediately below the opening 110a of the case 110 of each of the first tape unit supporting means 11 and the second tape unit supporting means 12, so that the tape unit TU drawn out from the case 110 can be guided toward tape unit stretching means 17 depicted in FIG. 1.

In the illustrated example, a guide roller 15 that guides the tape unit TU to the feeding unit 2 is disposed in the vicinity of the guide rollers 14 on the second tape unit supporting means 12 side.

The tape unit stretching means 17 includes: a rotating mechanism 172 connected to a lower end of a supporting member 171; an arm portion 173 connected to the rotating mechanism 172; a tape unit sandwiching unit 174 formed by a clamp or the like and disposed at an end of the arm portion 173; and a slide mechanism 175 that slidingly moves the supporting member 171 in an X-axis direction. The tape unit sandwiching unit 174 can sandwich both ends in the Y-axis direction of an end portion of the tape unit TU.

The rotating mechanism 172 can be rotated in a clockwise direction or a counterclockwise direction as viewed from the Y-axis direction. The rotating mechanism 172 can position the tape unit sandwiching unit 174 at a first sandwiching position P1 at which the tape unit sandwiching unit 174 can sandwich the tape unit TU drawn out from the first tape unit supporting means 11, a second sandwiching position P2 at which the tape unit TU drawn out from the second tape unit supporting means 12 is sandwiched, and a releasing position P3 at which the tape unit sandwiching unit 174 releases the tape unit TU after the tape unit TU is sandwiched by the feeding unit 2.

The slide mechanism 175 includes: a base 175a extending in the X-axis direction; a slider 175b capable of slidingly moving in the X-axis direction on the base 175a; and a ball screw mechanism not depicted in the figure which mechanism moves the slider 175b. When the slider 175b is slidingly moved in the X-axis direction on the base 175a, the tape unit sandwiching unit 174 can be slidingly moved in the X-axis direction together with the rotating mechanism 172.

The feeding unit 2 includes at least a driving roller 21, two driven rollers 22 opposed to each other in a Z-axis direction, and a moving mechanism 23 that makes the driving roller 21 and the driven rollers 22 brought into proximity or separated relative to each other. The moving mechanism 23 includes a guide rail 231 extending in the X-axis direction and a moving unit 232 movable in the X-axis direction on the guide rail 231. The moving unit 232 having substantially a U-shape as viewed from the side supports the two driven rollers 22 at respective ends of the moving unit 232. When the moving unit 232 moves along the guide rail 231, the driving roller 21 and the two driven rollers 22 can be brought into proximity or separated relative to each other in the X-axis direction.

Figure 3:
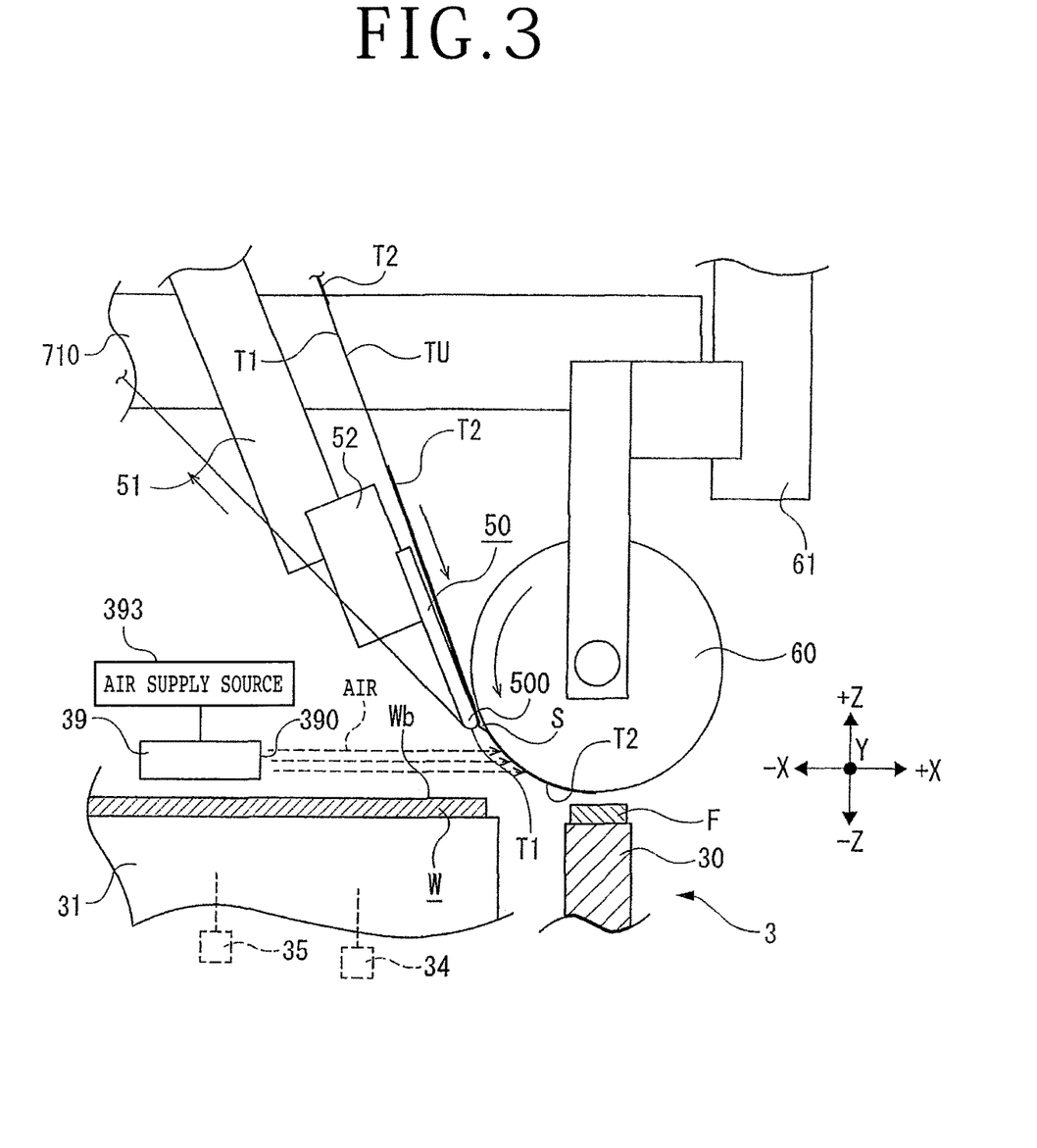
FIG. 3 is a sectional view depicting a state in which an affixing roller is set on standby at a position slightly above a stop position at which a dicing tape is affixed to a ring frame, and the dicing tape is made to conform to a side surface of the affixing roller by jetting air from an air nozzle.

As depicted in FIGS. 2 and 3, the peeling plate 50 that peels the dicing tape T2 off from the sheet T1 by bending the drawn-out tape unit TU, for example, extends in the Y-axis direction for a length equal to or more than the width (length in the Y-axis direction) of the tape unit TU, and is disposed via a movable member 52 on a base 51 obliquely extending from above toward the affixing roller 60. An end portion 500 on a lower end side of the peeling plate 50 is, for example, rounded in an R-shape. The movable member 52 can reciprocate on the base 51. When the movable member 52 moves to the lower end side of the base 51, the peeling plate 50 presses the sheet T1 of the tape unit TU and bends the sheet T1 at an acute angle, so that the dicing tape T2 can be peeled off from the sheet T1.

The base 51 is, for example, rotatable about an axis in the Y-axis direction. When the base 51 rotates by a predetermined angle, the angle of the peeling plate 50 with respect to the affixing roller 60 can be varied.

The ring frame holding portion 30 depicted in FIG. 2 has an annular shape as viewed in plan. An upper surface of the ring frame holding portion 30 is a holding surface formed of a porous member or the like and communicating with a suction source not depicted in the figure. The wafer holding portion 31 that is surrounded by the ring frame holding portion 30 and holds the wafer W within the opening of the ring frame F has a circular shape as viewed in plan. An upper surface of the wafer holding portion 31 is a holding surface formed of a porous member or the like and communicating with a suction source not depicted in the figure.

The wafer holding portion 31 and the ring frame holding portion 30 are supported from below by a support 32. Holding means moving means 34 reciprocating the holding means 3 in the X-axis direction via the support 32 is disposed below the support 32. The holding means moving means 34 includes a base 341 extending in the X-axis direction, a moving base 342 movable in the X-axis direction along the base 341, and a ball screw mechanism not depicted in the figure or the like which mechanism moves the moving base 342.

The support 32 and the moving base 342 are, for example, connected to each other via holding means raising and lowering means 35 formed by a cylinder mechanism or the like. The holding means raising and lowering means 35 raises and lowers the holding means 3 in the Z-axis direction via the support 32.

The affixing roller 60 rotatable about an axis in the Y-axis direction is disposed above the holding means 3, and extends in the Y-axis direction for at least a length equal to or more than the diameter of the dicing tape T2. The affixing roller 60 is, for example, connected with affixing roller positioning means 61 formed by a cylinder mechanism or the like. The affixing roller positioning means 61 can raise and lower the affixing roller 60 in the Z-axis direction in which the affixing roller 60 approaches or separates from the holding means 3. Incidentally, while both the affixing roller 60 and the holding means 3 can reciprocate in the Z-axis direction in the present embodiment, only one of the affixing roller 60 and the holding means 3 may be configured to be able to reciprocate in the Z-axis direction.

The air nozzle 39 that blows air so as to make the dicing tape T2 peeled off from the sheet T1 conform to the affixing roller 60 is disposed above the wafer holding portion 31, for example. The air nozzle 39 includes a jetting port 390 oriented to a +X direction side. The air nozzle 39 communicates with an air supply source 393 formed by a compressor or the like.

A slide mechanism 71 that enables tape unit taking means 76 depicted in FIG. 2 to reciprocate in the X-axis direction is disposed above a moving path of the holding means 3. The slide mechanism 71 includes: a base 710 extending in the X-axis direction; a slider 711 to which the tape unit taking means 76 is fixed and which can slidingly move in the X-axis direction on the base 710; and a ball screw mechanism not depicted in the figure which mechanism moves the slider 711.

The tape unit taking means 76 includes a supporting member 761 and a tape unit gripping portion 762 such as a clamp or the like disposed at an upper end of the supporting member 761. The tape unit gripping portion 762 can take over the gripping of both ends in the Y-axis direction of the end portion of the tape unit TU sandwiched by the tape unit sandwiching unit 174 of the tape unit stretching means 17.

The winding unit 4 is disposed on a moving path in the X-axis direction of the tape unit taking means 76. The winding unit 4 has a configuration substantially similar to that of the feeding unit 2. Specifically, the winding unit 4 includes at least a driving roller 41, two driven rollers 42 opposed to each other in the X-axis direction, and a moving mechanism 43 that makes the driving roller 41 and the driven rollers 42 brought into proximity or separated relative to each other. The moving mechanism 43 includes a guide rail 431 extending in the Z-axis direction and a moving unit 432 movable in the Z-axis direction on the guide rail 431. The moving unit 432 supports the two driven rollers 42 at respective upper ends of the moving unit 432. When the moving unit 432 moves along the guide rail 431, the driving roller 41 and the driven rollers 42 can be brought into proximity or separated relative to each other in the Z-axis direction.

Discarding means 73 discarding the sheet T1 is disposed at an end side on a −X direction side of the base 710 of the slide mechanism 71. The discarding means 73 includes: a winding unit 731 that grips both ends in the Y-axis direction of the end portion of the sheet T1 by a gripping portion 731a and winds the sheet T1 into a roll shape on an outer circumferential surface of the winding unit 731; a motor not depicted in the figure which motor rotates the winding unit 731; and a discarding box 732 that is disposed below the winding unit 731 and into which the sheet T1 is dropped when the gripping portion 731a releases the sheet T1 wound in a roll shape.

An example of operation of the tape affixing apparatus 1 will be described in the following. First, the wafer W is mounted on the wafer holding portion 31 of the holding means 3 such that the centers of the wafer W and the wafer holding portion 31 of the holding means 3 substantially coincide with each other, and the ring frame F is mounted on the ring frame holding portion 30. Next, the suction sources not depicted in the figure are activated, so that the wafer W is sucked and held by the holding surface of the wafer holding portion 31 and the ring frame F is sucked and held by the holding surface of the ring frame holding portion 30.

The tape unit stretching means 17, for example, selects the first tape unit supporting means 11, and extracts the tape unit TU from the first tape unit supporting means 11. Specifically, while the tape unit TU in a roll shape within the first tape unit supporting means 11 is rotated in a normal rotation direction (for example, clockwise direction as viewed from the near side of the paper plane) by the rotating means 114, the tape unit TU in a band shape is passed through the opening 110a and between the pair of guide rollers 14, and is fed downward by the pair of guide rollers 14. In addition, the tape unit sandwiching unit 174 is positioned at the first sandwiching position P1 by the rotating mechanism 172 and the slide mechanism 175. The tape unit sandwiching unit 174 holds both ends in the Y-axis direction of the end portion of the tape unit TU fed by the pair of guide rollers 14.

The slide mechanism 175 moves the tape unit sandwiching unit 174 holding the tape unit TU in the +X direction, and accordingly the tape unit TU is further drawn out from the first tape unit supporting means 11. When the rotating mechanism 172 rotates in a clockwise direction, for example, the tape unit TU sandwiched by the tape unit sandwiching unit 174 is hitched around the guide roller 15, and is passed between the driving roller 21 and the driven rollers 22 of the feeding unit 2 and hitched around the driving roller 21, and the tape unit sandwiching unit 174 is moved to the releasing position P3.

Next, the slide mechanism 71 slidingly moves the slider 711 in the +X direction, for example, along the base 710, and thus moves the tape unit gripping portion 762 to the releasing position P3. When the tape unit sandwiching unit 174 releases the tape unit TU at the releasing position P3, the tape unit gripping portion 762 takes over the gripping of both ends in the Y-axis direction of the end portion of the tape unit TU. Further, the slide mechanism 71 moves the tape unit gripping portion 762 in the −X direction. Thus, the tape unit TU gripped by the tape unit gripping portion 762 is drawn in the same direction and passed between the driving roller 41 and the driven rollers 42 of the winding unit 4, and the tape unit TU is guided to the winding unit 731 of the discarding means 73. Then, the gripping portion 731a of the winding unit 731 grips both ends in the Y-axis direction of the end portion of the tape unit TU.

The moving mechanism 23 of the feeding unit 2 brings the two driven rollers 22 into proximity to the driving roller 21, and the driving roller 21 and the two driven rollers 22 sandwich the tape unit TU. In addition, the moving mechanism 43 of the winding unit 4 brings the two driven rollers 42 into proximity to the driving roller 41, and the driving roller 41 and the two driven rollers 42 sandwich the tape unit TU.

As depicted in FIG. 3, the holding means moving means 34 moves the holding means 3 in the X-axis direction, and thereby the ring frame holding portion 30 holding the ring frame F is positioned directly below the affixing roller 60. In addition, as depicted in FIG. 3, for example, the holding means raising and lowering means 35 moves the holding means 3 in the Z-axis direction, and thereby the affixing roller 60 is positioned slightly above a stop height position at a time of affixing the dicing tape T2 to the ring frame F held by the ring frame holding portion 30.

In addition, as depicted in FIG. 3, the movable member 52 moves to the lower end side of the base 51, and thereby the peeling plate 50 is moved, for example, such that the end portion 500 is positioned at a position slightly above the moving path of air jetted from the air nozzle 39. Then, the tape unit TU passes through a gap S between the end portion 500 of the peeling plate 50 and a side surface of the affixing roller 60. Incidentally, the gap S is a small gap through which the tape unit TU can barely pass. In addition, the end portion 500 of the peeling plate 50 touches and presses the sheet T1 of the tape unit TU, and bends the tape unit TU with the sheet T1 on the inside to form the tape unit TU at an acute angle. Then, a dicing tape T2 is peeled off from the tape unit TU, and the dicing tape T2 is fed to a lower part of the affixing roller 60.

In this state, compressed air is supplied from the air supply source 393 to the air nozzle 39. Then, the air jetted from the air nozzle 39 is blown to the dicing tape T2 fed to the lower part of the affixing roller 60. The dicing tape T2 is thereby made to conform to the side surface of the affixing roller 60.

Figure 4:
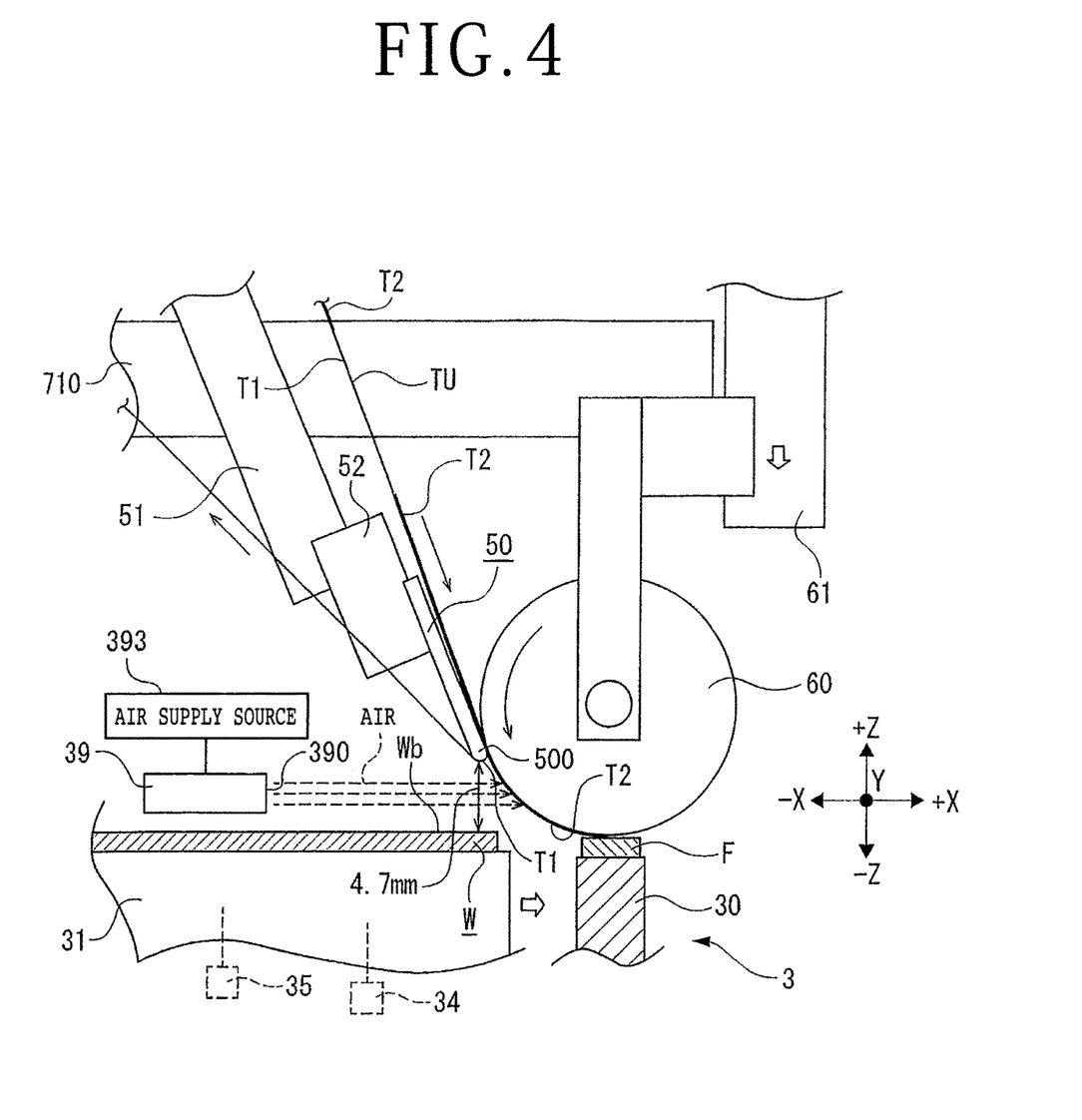
FIG. 4 is a sectional view depicting a state in which the dicing tape is being affixed to the ring frame and a wafer.

As depicted in FIG. 4, in the state in which the air makes the dicing tape T2 conform to the side surface of the affixing roller 60, the affixing roller positioning means 61 lowers the affixing roller 60 to a stop position at a time of affixing while the affixing roller 60 rotates at a predetermined rotational speed. The dicing tape T2 is thereby pressed from one side of the ring frame F held by the ring frame holding portion 30. Incidentally, a distance between a lowermost end of the end portion 500 of the peeling plate 50 depicted in FIG. 4 and an upper surface Wb of the wafer W is, for example, set at 4.7 mm, which is larger than conventional. In addition, the gap S depicted in FIG. 3 is further reduced.

The holding means moving means 34 feeds the ring frame holding portion 30 and the wafer holding portion 31 in the +X direction, and the rotating affixing roller 60 presses the dicing tape T2 against the wafer W and the ring frame F. At this time, the feeding unit 2 depicted in FIG. 2 rotates the driving roller 21 at a predetermined rotational speed, while the two driven rollers 22 are also rotated with the rotation of the driving roller 21. The tape unit TU is thus guided downward toward the holding means 3. In addition, in the winding unit 4, the driving roller 41 is rotated at a predetermined rotational speed, while the two driven rollers 42 are also rotated with the driving of the driving roller 41. The sheet T1 from which the dicing tape T2 is peeled off by the peeling plate 50 is guided from the peeling plate 50 to the discarding means 73.

When the holding means 3 is then moved in the +X direction to a predetermined position while the affixing roller 60 presses the dicing tape T2, one piece of the dicing tape T2 can be affixed to the wafer W and the ring frame F.

Figure 6:
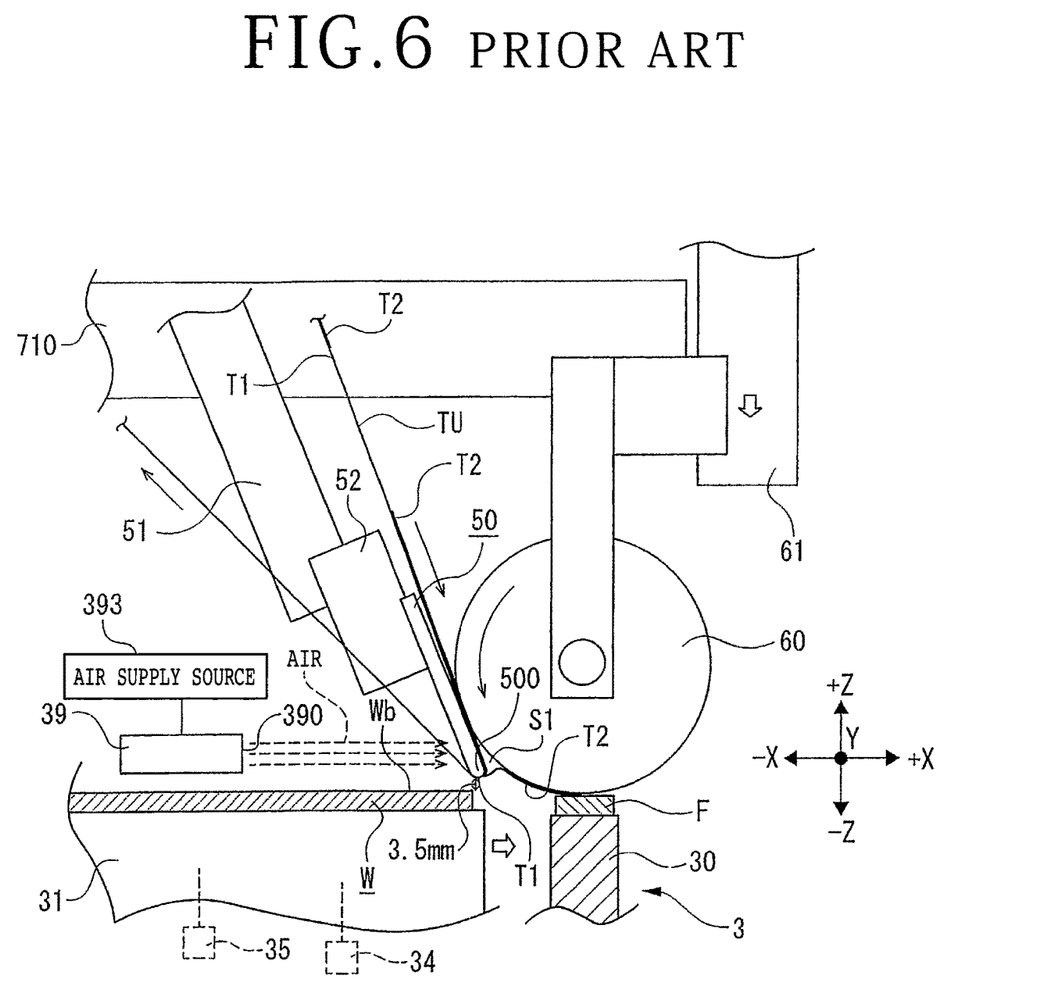
FIG. 6 is a sectional view of assistance in explaining a conventional problem in a state in which the dicing tape is being affixed to the ring frame and the wafer.

Here, a conventional problem at a time of affixing the dicing tape T2 to the wafer W and the ring frame F will be described briefly with reference to FIG. 6. Conventionally, when the movable member 52 moves to the lower end side of the base 51, the peeling plate 50 is moved such that the end portion 500 is positioned on the moving path of the air jetted from the air nozzle 39. A distance between the lowermost end of the end portion 500 of the peeling plate 50 positioned at the stop height position at a time of affixing and the upper surface Wb of the wafer W is, for example, set at 3.5 mm. Then, a large gap S1 is formed between the end portion 500 and the side surface of the affixing roller 60, and thereby the dicing tape T2 is slackened. Thus, even when air is jetted from the air nozzle 39, the dicing tape T2 does not sufficiently conform to the side surface of the affixing roller 60. The tension of the dicing tape T2 affixed to the ring frame F and the wafer W is therefore not uniform.

On the other hand, in the tape affixing apparatus 1 according to the present invention, the gap S between the end portion 500 of the peeling plate 50 and the side surface of the affixing roller 60 is reduced by positioning the peeling plate 50 at a time of affixing above the conventional position, the dicing tape T2 peeled off from the sheet T1 bent by the peeling plate 50 is made to conform to the side surface of the affixing roller 60 by the air blown from the air nozzle 39, and the dicing tape T2 is affixed to the ring frame F and the wafer W in a state of conforming to the side surface of the affixing roller 60 such that no slack occurs in the dicing tape T2. The tension of the affixed dicing tape T2 can therefore be made uniform.

Incidentally, as for a method of affixing the dicing tape T2 to the ring frame F, in the state in which the dicing tape T2 is made to conform to the side surface of the affixing roller 60 by the air blown from the air nozzle 39, the affixing roller positioning means 61 may lower the affixing roller 60 toward the ring frame holding portion 30, or the holding means raising and lowering means 35 may raise the wafer holding portion 31 and the ring frame holding portion 30 toward the affixing roller 60.

The sheet T1 from which the dicing tape T2 is peeled off, which is depicted in FIGS. 2 and 4, is wound by the winding unit 4, and is fed from the winding unit 4 to the winding unit 731 of the discarding means 73. The sheet T1 is wound in a roll shape on the outer circumferential surface of the winding unit 731 rotated by a motor not depicted in the figure, and is formed into a sheet roll. After the winding unit 731 forms the sheet roll by winding the sheet T1 for a predetermined length, the gripping portion 731a releases the gripping of the sheet roll, and thereby discards the sheet roll into the discarding box 732.

The wafer W integrated with the ring frame F via the dicing tape T2 is, for example, transferred to a dicing apparatus or the like by conveying means not depicted in the figure, and is subjected to dicing or the like. When an operation of affixing the dicing tape T2 to one wafer W is thus completed, a new wafer W is sequentially conveyed to the wafer holding portion 31, and a ring frame F is conveyed to the ring frame holding portion 30. An operation of affixing a dicing tape T2 and an operation of winding a sheet T1 peeled off from the dicing tape T2 are repeated as in the foregoing.

Figure 5:
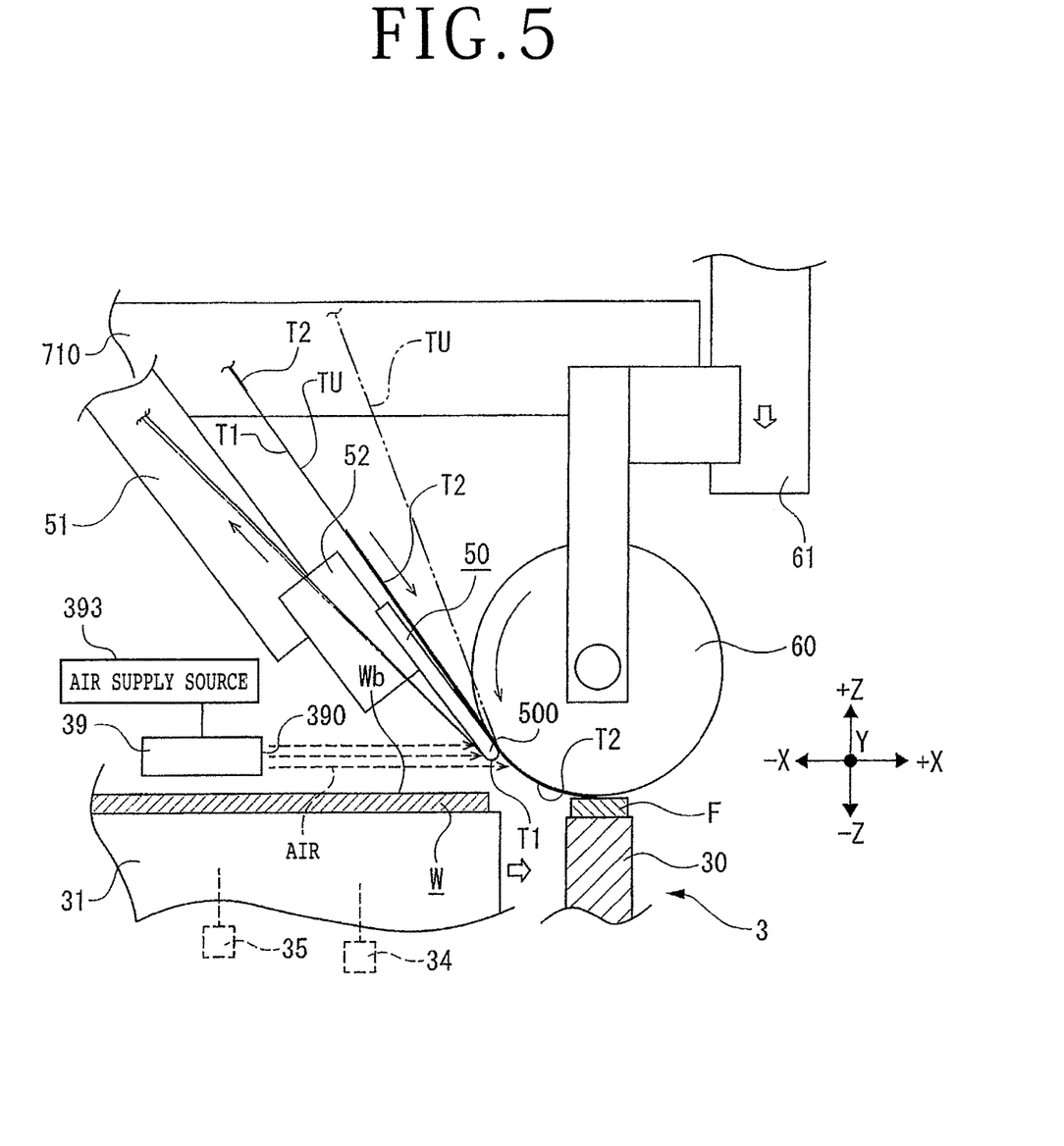
FIG. 5 is a sectional view depicting a case where the dicing tape is affixed to the ring frame and the wafer in a state in which the inclination of a peeling plate is increased more than conventional.

The tape affixing apparatus 1 according to the present invention is not limited to the present embodiment, but can be modified as appropriate within a scope where effects of the present invention can be exerted. For example, as depicted in FIG. 5, the angle of the tape unit TU at a time of affixing the dicing tape T2 may be made more acute than the angle of the conventional tape unit TU indicated by a chain double-dashed line by rotating the base 51 in the counterclockwise direction from a +Z direction to the −X direction, and thus tilting the peeling plate 50 toward a horizontal direction by a predetermined angle. When the peeling plate 50 is tilted toward the horizontal direction more than is conventional as depicted in FIG. 5, the gap between the end portion 500 of the peeling plate 50 and the side surface of the affixing roller 60 can be made to be a very small gap only allowing the tape unit TU to pass through.

In this state, the air jetted from the air nozzle 39 is blown to the dicing tape T2 fed to the lower part of the affixing roller 60. The dicing tape T2 is thereby made to conform to the side surface of the affixing roller 60. Thus, the dicing tape T2 is affixed to the ring frame F and the wafer W in a state of conforming to the side surface of the affixing roller 60 such that no slack occurs in the dicing tape T2. The tension of the affixed dicing tape T2 can therefore be made uniform.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A tape affixing apparatus for integrating a ring frame and a wafer disposed in an opening of the ring frame by a dicing tape by peeling off the dicing tape from a band-shaped sheet of a band-shaped tape unit formed by arranging and affixing circular dicing tapes in a longitudinal direction of the sheet, and affixing the dicing tape to the ring frame and the wafer, the tape affixing apparatus comprising:
    holding means including a ring frame holding portion holding the ring frame and a wafer holding portion holding the wafer within the opening of the ring frame;
    a feeding unit configured to feed the tape unit by rotating in a state of sandwiching the tape unit;
    a winding unit configured to wind the sheet by rotating in a state of sandwiching the sheet from which the dicing tape is peeled off;
    a peeling plate configured to be brought into contact with the sheet between the feeding unit and the winding unit, and peel the dicing tape off from the sheet by bending the tape unit with the sheet on an inside;
    an affixing roller configured to affix the dicing tape peeled off from the sheet to the ring frame and the wafer while pressing the dicing tape against the ring frame and the wafer; and
    an air nozzle configured to blow air so as to make the dicing tape peeled off from the sheet conform to the affixing roller,
    wherein the tape unit passes through a gap between an end portion of the peeling plate and a side surface of the affixing roller, the dicing tape peeled off at the end portion of the peeling plate is made to conform to the side surface of the affixing roller by the air blown from the air nozzle, and the dicing tape is affixed to the ring frame and the wafer such that no slack occurs in the dicing tape.

* * * * *